United States Patent [19]
Wiggenhorn

[11] 3,961,296
[45] June 1, 1976

[54] SLOTTED STRIP-LINE

[75] Inventor: James T. Wiggenhorn, Coral Springs, Fla.

[73] Assignee: Motorola, Inc., Chicago, Ill.

[22] Filed: Mar. 6, 1975

[21] Appl. No.: 555,930

[52] U.S. Cl. .............................................. 333/84 M
[51] Int. Cl.² .......................................... H01P 3/08
[58] Field of Search .............. 333/84 M, 84 L, 84 R, 333/73 S; 343/770, 771

[56] References Cited
UNITED STATES PATENTS

| | | | |
|---|---|---|---|
| 2,812,501 | 11/1957 | Sommers | 333/84 M UX |
| 3,044,066 | 7/1962 | Butler | 343/771 |
| 3,094,677 | 6/1963 | Theriot | 333/84 M UX |
| 3,471,812 | 10/1969 | Lackner | 333/73 S X |
| 3,659,228 | 4/1972 | Napoli | 333/84 M X |
| 3,681,717 | 8/1972 | Martin | 333/84 L X |
| 3,696,433 | 10/1972 | Killion et al. | 343/770 |

Primary Examiner—Paul L. Gensler
Attorney, Agent, or Firm—James W. Gillman; Eugene A. Parsons

[57] ABSTRACT

First and second spaced apart, coextensive ground planes with a center conductor positioned therebetween in spaced relation from each of said planes and the volume defined by said planes being filled with a dielectric material fixedly engaging said planes and said center conductor to form a strip-line transmission line, the characteristic impedance of said transmission line being adjusted to a predetermined amount by forming a channel through one of said ground planes to the center conductor. The channel in the strip-line increases the characteristic impedance so that the width of the center conductor can be increased, for a specific characteristic impedance, to significantly improve control of the production of the strip-line.

10 Claims, 4 Drawing Figures

SLOTTED STRIP-LINE

BACKGROUND OF THE INVENTION

1. FIELD OF THE INVENTION

The present invention pertains to strip-line transmission lines, which are generally used with printed circuit boards and the like to convey electrical signals from one point or component on a printed circuit board to another point or component on the printed circuit board. Strip-line transmission lines have many other uses but, since their use in conjunction with printed circuit boards is the most common, this use will be referred to throughout this disclosure.

2. DESCRIPTION OF THE PRIOR ART

There are two general types of transmission lines which are prior art to the present invention. The first general category is the micro strip transmission line which includes a single ground plane affixed to one surface of a dielectric material and a conductor affixed to the opposite surface of the dielectric material in spaced relation from the ground plane. This type of transmission line is unsatisfactory in many applications because it has very poor shielding and radiates or picks up extraneous energy easily. In fact, this transmission line is utilized as an antenna in many applications.

The second general category of transmission lines is the strip-line which includes two spaced apart ground planes affixed to opposite sides of dielectric material with a center conductor embedded in the dielectric material parallel with and spaced from each of the ground planes. This transmission line has relatively good shielding but the size becomes a serious manufacturing problem. For example, in a normal four-layer printed circuit board having a thickness of 0.062 inches, a center conductor spaced approximately 0.020 inches from one of the ground planes must have a width of approximately 0.013 inches to provide a characteristic impedance of 50 ohms. When the strip-line and the remainder of the printed circuit board are manufactured simultaneously the tolerance would typically be plus or minus 0.002 inches of a line or a little poorer than plus or minus 15%.

SUMMARY OF THE INVENTION

The present invention pertains to an improved strip-line transmission line wherein first and second spaced apart ground planes have a center conductor positioned therebetween in parallel spaced relation from each of the ground planes with a dielectric material filling the volume between the ground planes and an elongated groove is formed in one of the ground planes so that the characteristic impedance of the strip-line is increased to allow a substantially wider center conductor to be utilized while still retaining relatively good shielding.

It is an object of the present invention to provide a new and improved strip-line transmission line.

It is a further object of the present invention to provide an improved strip-line transmission line having a slot in one of the ground planes overlying the center conductor and extending the length of the transmission line to raise the characteristic impedance of the transmission line so that a wider and, therefore, better controlled center conductor may be utilized.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures.

DESCRIPTION OF THE PREFERRED EMBODIMENTS

Figure 1:
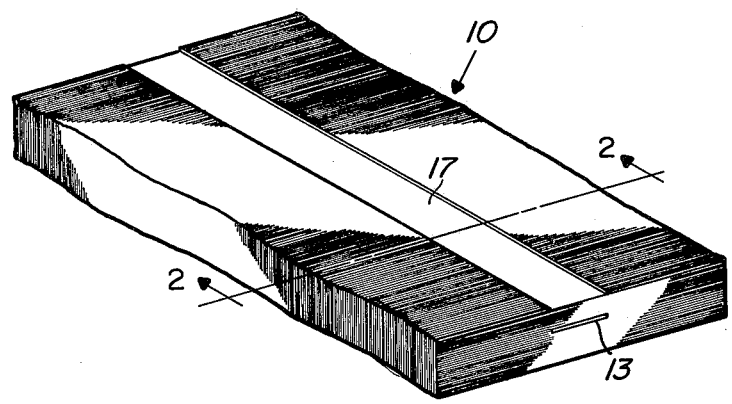
FIG. 1 is a view of a strip-line transmission line in a printed circuit board, portions thereof removed, embodying the present invention.
Figure 2:
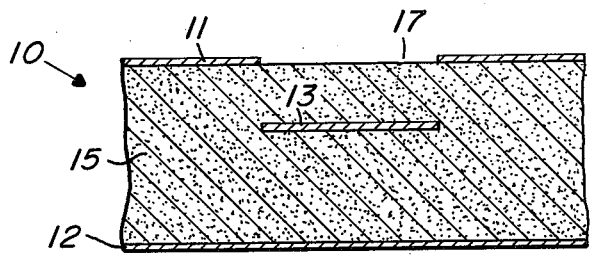
FIG. 2 is an enlarged sectional view as seen from the line 2—2 in FIG. 1.

Referring specifically to FIGS. 1 and 2, the numeral 10 generally designates a strip-line transmission line formed as a portion of a printed circuit board. The remainder of the printed circuit board, including the terminating devices, is removed since it does not form a portion of this invention. The strip-line 10 includes a first ground plane 11, a second ground plane 12, a center conductor 13 and dielectric material 15 filling the volume between the first and second ground planes 11 and 12. Since the present embodiment is drawn specifically toward printed circuit boards, the ground planes 11 and 12 and the center conductor 13 are formed of copper plated, or otherwise affixed to the dielectric material 15 in any of the processes well known to those skilled in the art of forming printed circuit boards and strip-line transmission lines. Further, the dielectric material in this embodiment is glass epoxy, although it should be understood that any dielectric material having a dielectric constant greater than one might be utilized. Further, in the present embodiment the printed circuit board in which the strip-line 10 is formed consists of a four-layer board which, as is well known to those skilled in the art, may be formed in several different ways including laminating a plurality of printed circuit boards together. The fourth layer of copper is not shown in the figures because it does not form a portion of the invention and it is utilized in other portions of the printed circuit board, not shown.

An elongated channel 17 is formed in the strip-line 10 by removing the ground plane 11 overlying the center conductor 13. In the embodiment illustrated in FIGS. 1 and 2 the elongated channel 17 is the same width as the center conductor 13 and extends the length of the strip-line 10. The dielectric material 15, which in this embodiment is glass epoxy, has a dielectric constant of approximately 5.0 as compared to air which has a dielectric constant of 1. By removing the ground material 11 from adjacent the center conductor 13 the characteristic impedance of the strip-line 15 is increased.

Figure 3:
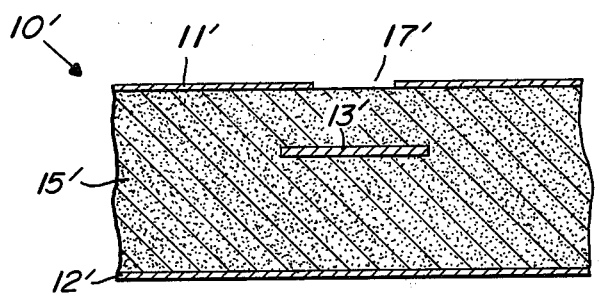
FIG. 3 is an enlarged sectional view similar to FIG. 2 of another embodiment.

Referring to FIG. 3, another embodiment of the strip-line is illustrated wherein like parts are designated with like numbers having a prime added to indicate a different embodiment. In FIG. 3 strip-line 10' has an upper ground plane 11', a lower ground plane 12', a center conductor 13', dielectric material 15' and a channel 17'. The channel 17' is not as wide as the center conductor 13' so that all of the ground plane above the line has not been removed. Therefore, the impedance of the embodiment 10' is somewhat less than the impedance of the embodiment 10 in FIGS. 1 and 2.

Figure 4:
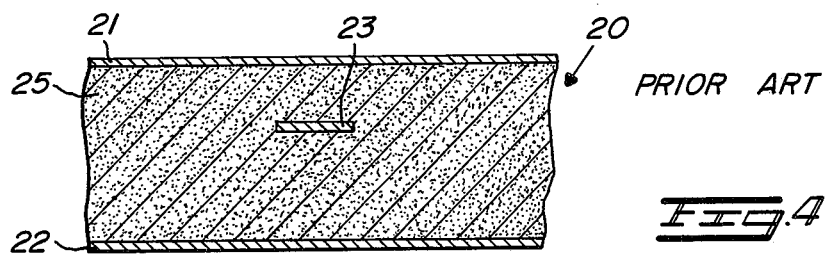
FIG. 4 is an enlarged sectional view similar to FIG. 2 of a prior art strip-line transmission line.

Referring specifically to FIG. 4, a prior art strip-line, generally designated 20 is illustrated having an upper ground plane 21, a lower ground plane 22, a center conductor 23 and a dielectric material 25 filling the volume between the upper and lower ground planes 21 and 22. In the prior art srip-line 20 of FIG. 4, the center conductor 23 is completely surrounded by the dielectric material 25 having a dielectric constant greater than one. Thus, the characteristic impedance of the strip-line 20 is relatively low and the center conductor 23 must be made relatively narrow if a high characteristic impedance is desired. For example, the strip-line 20 is formed in a four-layer, glass epoxy printed circuit board with the distance between the center conductor 23 and the upper ground plane 21 approximately one-half of the distance between the center conductor 23 and the lower ground plane 22. The thickness of the strip-line 20 is approximately 0.062 inches and the width of the center conductor 23 is approximately 0.013 inches to provide a 50 ohm characteristic impedance.

By forming the slot 17 in the strip-line 10, the width of the center conductor 13 can be increased substantially and the characteristic impedance will remain approximately the same. For example, the strip-line in FIG. 4 has a characteristic impedance of 50 ohms and the width of the center conductor is approximately 0.013 inches. Assuming that the materials and thickness of the strip-line 10 in FIGS. 1 and 2 is the same as the width and materials of the strip-line 20 in FIG. 4, the width of the center conductor 13 will be approximately 0.030 inches for a characteristic impedance of 50 ohms. The printed circuit board containing the strip-line 10 is made the same as the printed circuit board containing the strip-line 20 so that the tolerances of manufacture will be the same. Thus, the center conductor 13 of the strip-line 10 will have a width of 0.030 inches plus or minus 0.002 inches, or approximately 6% tolerance. This is a significant improvement in line definition and will yield a corresponding improvement in control of the characteristic impedance of the lines. In the event that it is desirable to use a center conductor which is wider than the center conductor of the strip-line 20, but space or other considerations limit the width, the channel can be reduced in size as disclosed in FIG. 3 to produce a smaller increase in the impedance and, thus, require a smaller increase in the width of the center conductor to maintain the desired or predetermined characteristic impedance. It should also be noted that this improved strip-line transmission line is an ideal tool for matching strip-line transmission lines to micro strip transmission lines or any other devices. By adjusting the dielectric material, the position of the center conductor, the width of the center conductor and the width of the channel adjacent the center conductor substantially any desired size, characteristic impedance or matching characteristics can be obtained. Further, the shielding effect of the slotted strip-line is greater than the shielding effect for a micro strip transmission line, so that the present invention provides an improved strip-line transmission line with greater control in the manufacture while still including substantial shielding.

While I have shown and described specific embodiments of this invention, further modifications and improvements will occur to those skilled in the art. I desire it to be understood, therefore, that this invention is not limited to the particular form shown and I intend in the appended claims to cover all modifications which do not depart from the spirit and scope of this invention.

I claim:

1. An improved strip-line transmission line comprising:
   a. first and second spaced apart ground planes formed of parallel, coextensive sheets of conductive material;
   b. a center conductor positioned between said first and second ground planes and extending from one end of the transmission line to the other, parallel with said ground planes and spaced therefrom;
   c. a dielectric material filling the volume between said ground planes and fixedly engaging said first and second ground planes and said center conductor; and
   d. an elongated channel formed in one of said first and second ground planes in overlying relationship to said center conductor, said channel extending the length of said center conductor, and the width of said channel being adjusted to introduce a predetermined impedance in the transmission line throughout the length thereof.

2. An improved strip-line transmission line as claimed in claim 1 wherein the dielectric material is a material having a dielectric constant greater than one.

3. An improved strip-line transmission line as claimed in claim 2 wherein the dielectric is glass epoxy.

4. An improved strip-line transmission line as claimed in claim 1 wherein the strip-line is formed in and as part of a printed circuit board with the ground planes being formed of copper affixed to said board.

5. An improved strip-line transmission line as claimed in claim 4 wherein the board is a four-layer glass epoxy board with copper layers forming the ground planes and the center conductor.

6. An improved strip-line transmission line as claimed in claim 1 wherein the thickness of the dielectric material between the center conductor and one of the first and second ground planes is greater than the thickness of the dielectric material between the center conductor and the other of the first and second ground planes.

7. An improved strip-line transmission line as claimed in claim 6 wherein the channel is formed in the ground plane closest to the center conductor.

8. An improved strip-line transmission line as claimed in claim 1 wherein the thickness of the dielectric material between the center conductor and the first ground plane is approximately one-half the thickness of the dielectric material between the center conductor and the second ground plane.

9. An improved strip-line transmission line as claimed in claim 8 wherein the channel is formed in the first ground plane.

10. An improved strip-line transmission line as claimed in claim 1 wherein the width of the channel and the width of the center conductor are approximately equal and the ratio of the width of the center conductor to the distance between the center conductor and the ground plane opposite the channel is adjusted to introduce a predetermined impedance in the transmission line.

* * * * *